United States Patent
Schmitt et al.

[11] Patent Number: 5,977,574
[45] Date of Patent: *Nov. 2, 1999

[54] HIGH DENSITY GATE ARRAY CELL ARCHITECTURE WITH SHARING OF WELL TAPS BETWEEN CELLS

[75] Inventors: Jonathan Schmitt, Bloomington; Timothy V. Statz, Minneapolis, both of Minn.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/829,520

[22] Filed: Mar. 28, 1997

[51] Int. Cl.⁶ .................................................. H01L 27/118
[52] U.S. Cl. ........................... 257/207; 257/211; 257/206
[58] Field of Search ....................................... 257/202–211

[56] References Cited

U.S. PATENT DOCUMENTS

| | | |
|---|---|---|
| 4,701,860 | 10/1987 | Mader . |
| 4,727,493 | 2/1988 | Taylor, Sr. . |
| 4,742,019 | 5/1988 | Béchade ..................................... 437/48 |
| 4,745,084 | 5/1988 | Rowson et al. .......................... 257/208 |
| 4,786,904 | 11/1988 | Graham, III et al. . |
| 4,864,381 | 9/1989 | Seedfeldt et al. . |
| 4,928,160 | 5/1990 | Crafts . |
| 4,975,758 | 12/1990 | Crafts . |
| 4,978,633 | 12/1990 | Seedfeldt et al. . |
| 5,055,716 | 10/1991 | El Gamel . |
| 5,068,548 | 11/1991 | El Gamel . |
| 5,087,839 | 2/1992 | Whittaker et al. . |
| 5,214,299 | 5/1993 | Gal et al. ................................. 257/208 |
| 5,260,881 | 11/1993 | Agrawal et al. . |
| 5,289,021 | 2/1994 | El Gamal . |
| 5,298,774 | 3/1994 | Ueda et al. ............................. 257/208 |
| 5,309,091 | 5/1994 | El-Ayat et al. . |
| 5,329,460 | 7/1994 | Agrawal et al. . |
| 5,341,041 | 8/1994 | El Gamal . |
| 5,384,472 | 1/1995 | Yin . |
| 5,399,517 | 3/1995 | Ashtaputre et al. ...................... 437/51 |
| 5,404,034 | 4/1995 | Yin . |
| 5,420,447 | 5/1995 | Waggoner ............................... 257/208 |
| 5,444,276 | 8/1995 | Yokota et al. ........................... 257/211 |
| 5,452,245 | 9/1995 | Hickman et al. ....................... 257/206 |
| 5,473,195 | 12/1995 | Koike ...................................... 257/775 |
| 5,493,135 | 2/1996 | Yin . |
| 5,581,202 | 12/1996 | Yano et al. ............................. 326/101 |
| 5,612,553 | 3/1997 | Arakawa ................................. 257/206 |
| 5,631,478 | 5/1997 | Okumura ................................ 257/211 |

FOREIGN PATENT DOCUMENTS

0782188 A2  7/1997  European Pat. Off. .

*Primary Examiner*—David B. Hardy

[57] ABSTRACT

An arrangement and method for making a gate array architecture locates the well taps at the outer corners of each gate cell. The power buses are also located at the outside of the gate cell as well, enabling sharing of the well taps and the power buses. The location of the well taps at the outside corners of the standard cell reduces the number of transistors in a single repeatable cell from eight transistors to four transistors.

19 Claims, 6 Drawing Sheets

HIGH DENSITY GATE ARRAY CELL ARCHITECTURE WITH SHARING OF WELL TAPS BETWEEN CELLS

FIELD OF THE INVENTION

The present invention relates to the field of gate array cell architecture, and more particularly, to a gate array cell architecture having a high density and a method of making the same.

BACKGROUND OF THE INVENTION

Gate arrays are used extensively to fabricate integrated circuits which perform customer specialized functions. The semiconductor devices of the gate arrays are designed into base patterns and fabricated into wafers for customer specific functional interconnection during metallization. Consequently, the integrated circuit semiconductor devices can be interconnected to perform the logic functions desired by a customer in the relatively short time needed to form the metallization patterns.

The metallization process by which the pre-existing transistors and other active devices in the base set are interconnected to form functional configurations typically uses one or more metallization layers, a pattern of contacts that connect from the metallization layers to the semiconductor regions, and vias to interconnect the successive metallization patterns.

Higher density and more reliable devices, with lower levels of power consumption, are desirable. However, integrated circuit design rules impose a number of constraints on the interconnection of the transistors, hampering design efforts towards higher density. For example, a gate array design must satisfy minimum polysilicon width dimensions, minimum spacing between polysilicon conductors, minimum metal width dimensions, minimum spacing between metal conductors, minimum dimensions for contacts, minimum dimensions for vias, and constraints as to vertical placement on the various consecutive layers. Gate array cell architecture designers set a track pitch of routing tracks, connecting gate cells in an array, at a constant value that satisfies the largest of all of the minimum spacings. These limitations may be understood with respect to FIGS. 1 and 2.

FIG. 1 is a schematic depiction of a cell of a prior art gate array, for purposes of explaining some limitations of the prior art gate arrays. This cell, which is replicated numerous times in a tile pattern on a chip, h a number of polysilicon layer patterns 10 fur transistor gate electrodes. A P channel diffusion area 12 forms the P channel device and an N channel diffusion area 14 forms the N channel device. A P channel well tap is provided at area 16, and an N channel well tap is provided at area 18.

The lower half of the gate cell in FIG. 1 has its components interconnected to form a device within the gate cell, such as a NAND gate, AND gate, NOR gate and OR gate. The interconnecting of the components of the gate cell to form the device is performed in metallization layers. The first metallization layer forms the primary interconnections of the components of the gate cell that form the devices. For reasons described below, it is often necessary, however, to use a second metallization layer to complete the interconnection of the devices within the gate cell.

In FIG. 1, the components in the lower half of the gate cell are connected together by the first metal in the first metallization layer to form a NAND gate with input ports A and B and an output port Z. These interconnections are depicted as dotted regions in FIG. 1. The VSS and VDD power buses (20, 22) for the devices extend vertically across the gate cells, as indicated in FIG. 1. These buses 20, 22 limit the amount of interconnection that is possible within the gate cells to the area located horizontally between the two buses 20, 22, at least within the first metallization layer. Due to the limited amount of interconnectivity caused by the location of the buses in the first metallization layer, the second metallization layer is typically required to form interconnections within the gate cell to form the devices. The use of second metal in the second metallization layer to form the devices creates a "porosity" problem in the conventional architecture.

In FIG. 2, cells 24 are arranged in cell placement columns 26, separated by routing columns 28. The horizontal routing tracks through a cell 24 are provided in the second metallization layer direction, and are also seen in FIG. 1 with reference numeral 30. These routing tracks (hereinafter referred to as m2 routing tracks) 30 are used to provide horizontal connections between gate cells 24. The vertical routing tracks 32, (also shown in FIG. 1 and hereinafter referred to as m1 routing tracks) extend in a vertical direction through the gate cells 24 and in the routing channels 28. These ml tracks 32 are found in the first metallization layer.

The problem caused by using the second metallization layer to form the devices within the gate cell becomes apparent with reference made to FIGS. 1 and 2. In FIG. 1, there are only three m2 tracks 30 that pass through the device. When the second metal is used to interconnect the components of the gate cell to form a device, the m2 routing tracks 30 running horizontally will be effectively not useable for connecting the device in the gate cell to the device in another gate cell. In other words, the m2 routing track 30 will be blocked. With only three possible m2 routing tracks 30 running through the device, and given the limited amount of interconnectivity available between the power buses 20, 22, it is likely that the three m2 routing tracks 30 will be blocked by the second metal required to complete formation of the device. Since there are very few or no "route throughs" in such cells, these cells are considered to have a "low porosity".

The low porosity of the cells causes many detours to be taken when routing devices together, as depicted in the example of FIG. 2. In this case, connecting the device of gate cell 24A to the device of gate cell 24B requires a tortuous path to a gate cell which does not have a device formed in the cell so that the route through may be taken. Connection is then made to the first metallization layer in the routing column 28 and then horizontally in the second metallization layer to the second device in the gate cell 24B.

There are a number of disadvantages that arise from the above-described architecture, including the unbalanced rise and fall time of the P and N channel devices which are of the same size. Changing the relative sizes of the P diffusion area and the N diffusion area is difficult due to the limitations created by the cell routing. Also, higher densities are difficult to achieve due to the practice of providing unvarying track pitches between the routing tracks, both in the vertical and in horizontal directions, in order to meet the minimum design standards. In addition, due to the low porosity, power buses typically only have one contact with the individual devices, so that there is a relatively high effective resistance and relatively unreliable contact since it is only being made at one point.

A further consideration of gate array design is the size of the gate cell, which is typically 8 transistors, as seen in prior art FIG. 1. This cell size is due in part to the well taps 16 and 18 that are located between the devices. A reduction in cell size would have a number of advantages for a designer, including tighter placement, reduced dead space within cells, and more flexibility in location of gaps in the cell placement for global routing.

SUMMARY OF THE INVENTION

There is a need for a gate array architecture with a reduced cell size using existing manufacturing technology.

This and other needs are met by the present invention which provides a gate array cell architecture comprising an array of gate cells, at least one of the gate cells having first and second devices. The first device includes a channel diffusion area and transistor gate electrodes. The second device includes a second channel diffusion area and transistor gate electrodes. Well taps for the devices are provided at the outer corners of the gate cell.

The location of the well taps at the outer corners of the gate cell in accordance with the present invention has a number of advantages. For example, the power buses are also able to be located at the outer areas of the gate cell, as provided in certain embodiments. The power buses and the taps can then be shared between gate cells in the gate array, increasing density. The sharing of the power buses and the wells, as provided in certain embodiments of the invention, reduces the tapping density within the cells by half. Moving the taps to the outside of the gate cell also reduces the number of transistors in a single gate cell, from eight in the prior art to four. This allows for tighter placement, less dead space in the cells, and more flexibility in global routing and placement.

The foregoing and other features, aspects and advantages of the present invention will become more apparent from the following detailed description of the present invention when taken in conjunction with the accompanying drawings.

DETAILED DESCRIPTION OF THE ILLUSTRATIVE EMBODIMENTS

Figure 3:
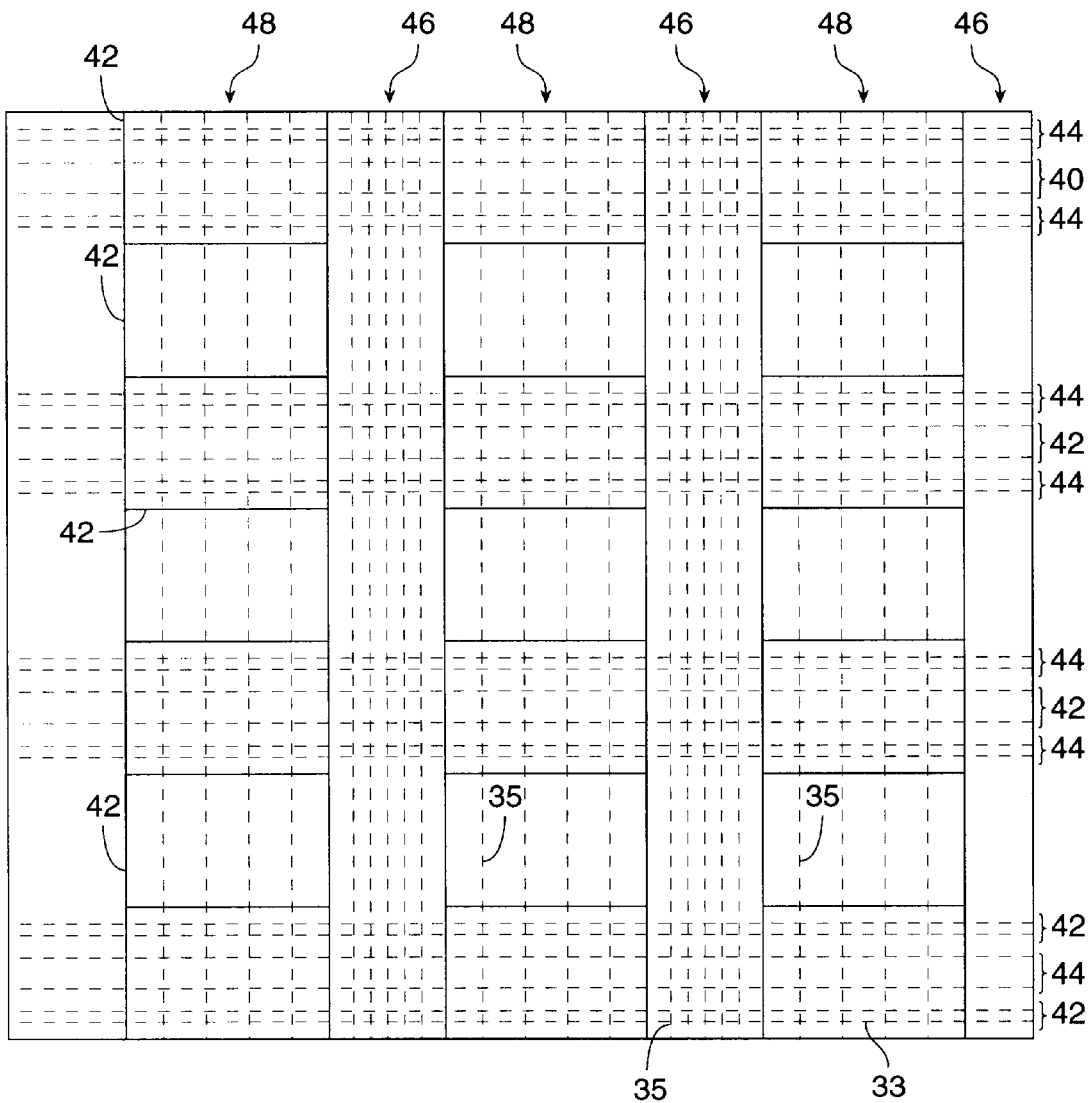
FIG. 3 is a schematic depiction of a gate array cell architecture having a variable track pitch.

FIG. 3 is a schematic depiction of a gate array cell architecture in accordance with an embodiment of the present invention. In this embodiment, the m1 routing tracks and the m2 routing tracks 33 are laid out with variable track pitches, to take advantage of the different design laws for different areas of the gate array cell. (For clarity of illustration and understanding, only every other row of gate cells is depicted with the m2 routing tracks. However, each row of gate cells will have m2 routing tracks in preferred embodiments.) For example, a 1.6 micron limit for the m2 routing tracks 33 is provided in certain areas and is required due to poly to spacing and poly to diffusion spacing. In these areas 40 of gate cell 42, the track pitch for m2 is 1.6 microns. However, the design law for the diffusion area would allow the track pitch for m2 to be 1.4 microns. Hence, the m2 track pitch in the present invention in the diffusion area is set at 1.4 microns. The diffusion area is indicated by reference numeral 44. The varying of the m2 track pitch within the cell makes the cell area smaller for the same number of tracks.

The depiction of FIG. 3 is schematic only, to show variation in the track pitch. The precise variation of the pitch and location of the diffusion areas and other areas of the gate cells is dependent on the specific gate cells themselves, and are thus not shown in more detail.

The m1 routing tracks 35, which run vertically, are also variable in certain embodiments. In the cell placement column 46, the m1 routing tracks 35 may be set to 1.6 microns without violating design laws, and set to 1.4 microns in the channel routing columns 49, without violating design laws in that region. By setting the track pitch to 1.4 microns in the channel routing columns 48, additional m1 routing tracks 35 are available in the routing column 48. This increases the available connection paths for the gate array cell architecture.

Figure 6:
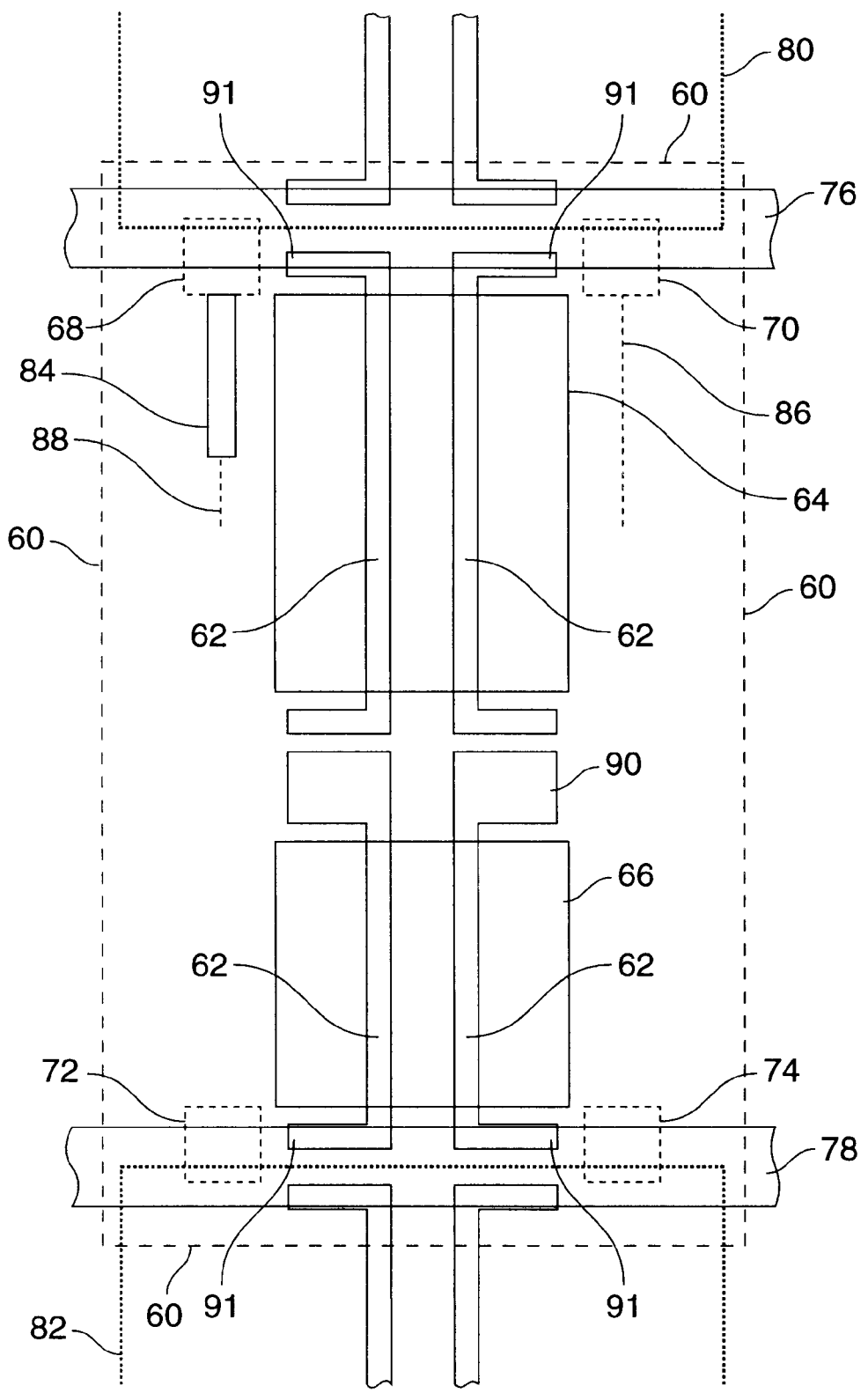
FIG. 6 is a schematic depiction of a cell layout in accordance with an embodiment of the present invention, having well taps located at outer corners of the cell.

Although FIG. 3 depicts both the m2 routing tracks 33 and the m1 routing tracks 35 as having a variable track pitch, in certain preferred embodiments, such as that depicted in FIG. 6, the pitch is constant and does not vary. An exemplary constant track pitch is 1.4 microns. The specific track pitches given above are exemplary only, as other specific track pitches are possible and may be required due to different design laws according to the different manufacturing processes available to one of ordinary skill in the art.

Figure 4:
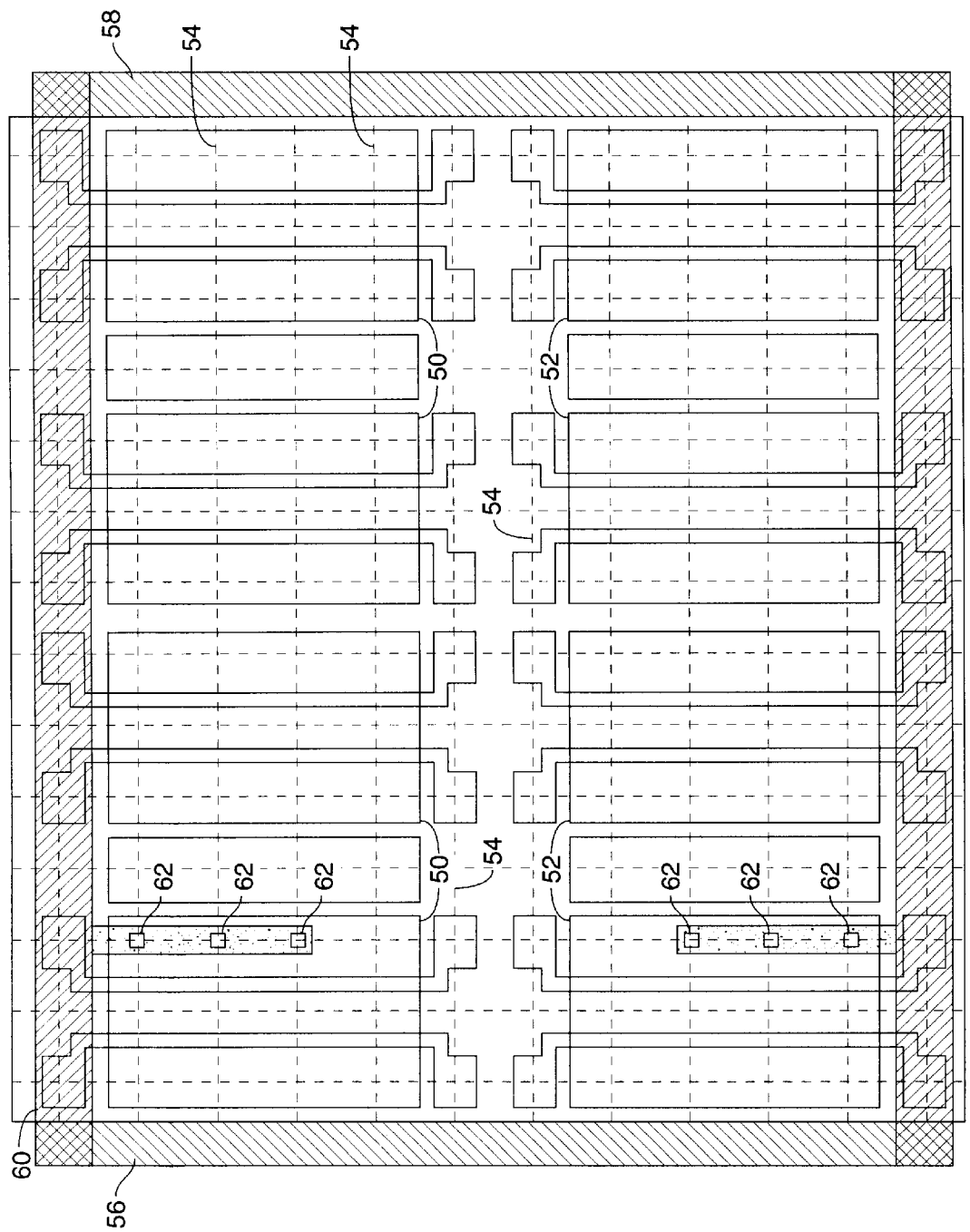
FIG. 4 is a schematic depiction of a cell layout in which multiple contacts are provided for a power connection within the cell.

As described with respect to FIG. 3, certain embodiments of the present invention also provide for improved power connection for the devices within the gate cells. This improved power connection is provided by multiple contact points of the devices within the gate cells to a power source. Multiple contact points are made possible by using a cell layout having an increased porosity (reduced or no second metal blockages) in the second metallization layer. Such a cell layout is provided by orienting the devices perpendicularly to the second metal routing tracks, as depicted in FIG. 4. This perpendicular orientation of the devices to second metal routing tracks has been used in a commercially available gate array cell architecture, the 0.8 micron gate array library manufactured by Advanced Microsystems, Inc. of Pocatello, Id. As apparent in FIG. 4, the P channel device 50 and the N channel device 52 are oriented 90° with respect to the m2 routine tracks 54, shown as having a constant track pitch in this embodiment, although the m2 track may have a variable track pitch in other embodiments, as described earlier. The 90° orientation of the P and N channel devices 50, 52 to the m2 routing tracks 54 provides a number of route through tracks and possible contact points. The multiple port locations alleviate congestion.

Although the present invention permits multiple power contact points, in certain embodiments only one power contact point is employed. In these embodiments, the m1 traces through the cell are used to provide multi-directional first layer metal 1 routing, making a single power contact point more desirable.

Another feature of the known gate array cell architecture is the providing of the power bus VSS 56 and VDD 58) further towards the outside of the gate array cell, as illustrated. Power buses 56, 58 are in the first metallization layer. A second metallization layer power connection 60 runs horizontally between the power buses 56, 58. From this power connection 56, the P channel device 50 and the N channel device 52 may be connected by second metal.

The present invention provides for connecting the P and N channel devices 50, 52 to the power connection 60 by multiple contact points 62, as depicted in FIG. 4. These multiple contact points reduce the effective resistance on the diffusion side, and add reliability to the power lines. The present invention therefore takes advantage of the increased porosity of a gate array cell architecture in which the devices are oriented perpendicularly to the second metal routing tracks. Furthermore, the increased porosity provides multiple contacts for source or drain, thereby alleviating congestion.

Although FIG. 4 depicts three contact points for the power connection of the P channel device 50, this is exemplary only as a different plurality of contact points are contemplated within the spirit and scope of the present invention.

Figure 5:
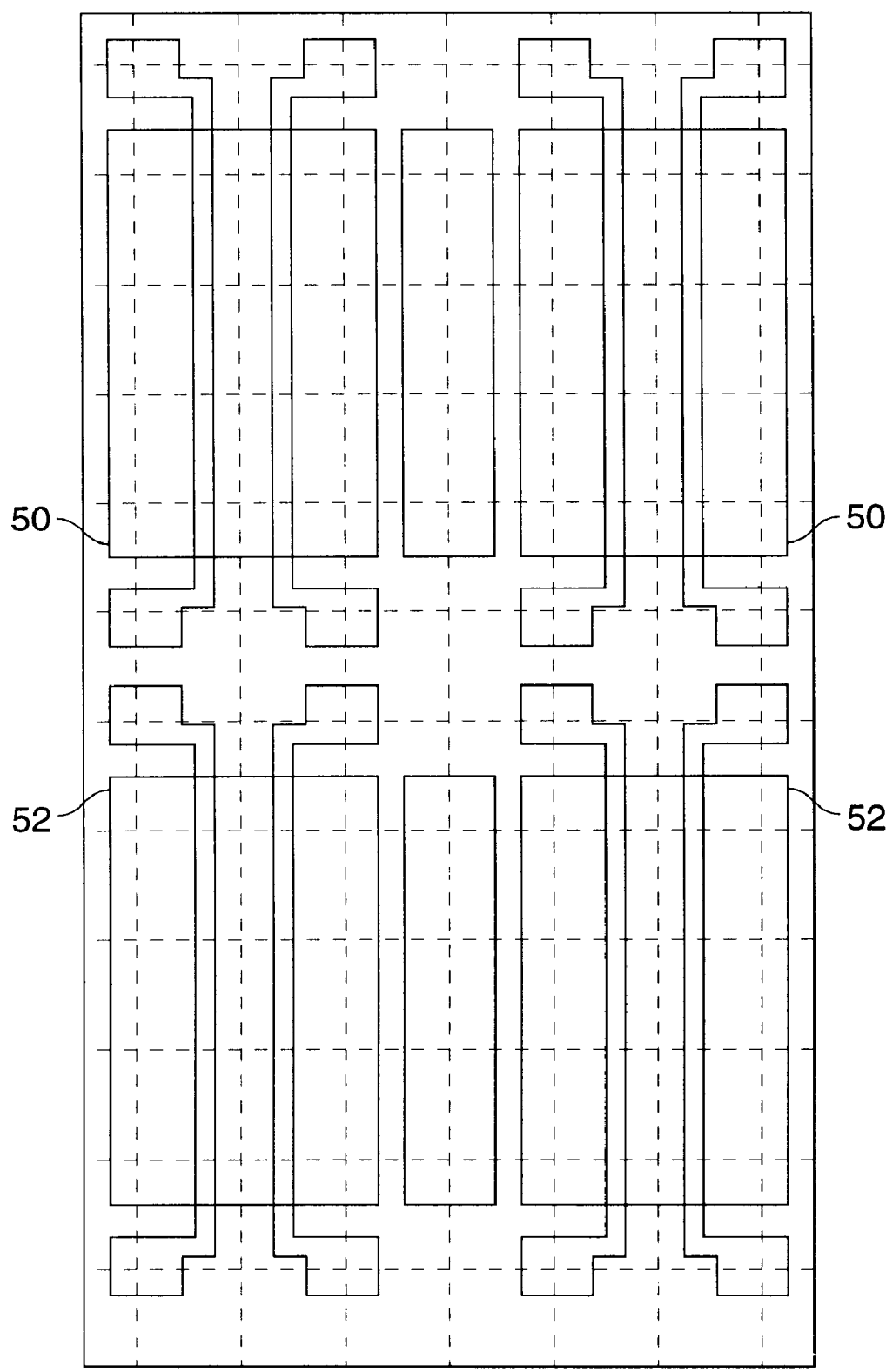
FIG. 5 is a schematic depiction of a cell layout having different sized P and N channel devices.

Another aspect of the present invention is depicted in FIG. 5 in which the P and N channel devices 50, 52 are of different sizes. In the embodiment of FIG. 5, the P channel device is larger in area than the N channel device 52. By varying the channel widths, as illustrated, a balancing of the P and N channel devices 50, 52 may be obtained. The balancing compensates for the fact that the P channel drive strength is usually weaker than N channel drive strength.

An advantageous feature of the present invention is that the numberof touting tracks is left to the cell architect, and is not constrained by other factors. For example, prior art architectures are set based on symmetry, which forces the number of routes.

In an exemplary embodiment of the present invention, the P channel device width may be 5.5 microns, while the N channel device width is 4.1 microns, although different device widths are contemplated within the spirit and scope of the present invention. By providing different widths of the P and N channel devices 50, 52, the difference between the rise and fall times of the cells is minimized.

The varying of the P and N channel device widths is facilitated by the orientation of the devices perpendicularly to the m2 routing tracks, as depicted in FIG. 5, since there are less problems caused by cell routing when the orientation of the gate cells is as illustrated, rather than in more conventional gate array cell architectures. In prior architectures, the gates are the same width so that columns could be skipped for channel routes at a ½ cell pitch. By varying the width in such architectures, however, symmetry is lost, causing placing constraints. By turning the transistors on their sides, according to the present invention, the pitch for channels is determined by the number of transistors in the cell. However, the balancing of the P and N channel devices in a gate array cell architecture has utility in whichever orientation of the devices to the m2 routing tracks are used. The variable track pitch, although not shown in FIG. 5, may also be used in both the m1 metallization layer and the m2 metallization layer in the embodiment of FIG. 5 in order to provide a denser gate array cell architecture and increased routing capability.

FIG. 6 depicts an embodiment of a gate cell having a reduced cell size in accordance with an embodiment of the present invention. Since the pitch for routing channels is determined by the number of transistors in the cell, as discussed above, the reduction in the number of transistors per cell in the embodiment of FIG. 6 is especially advantageous. The gate cell 60 has a number of polysilicon layer patterns 62 for transistor gate electrodes. A P channel diffusion area 64 forms the P channel device and an N channel diffusion area 66 forms the N channel device.

Figure 1:
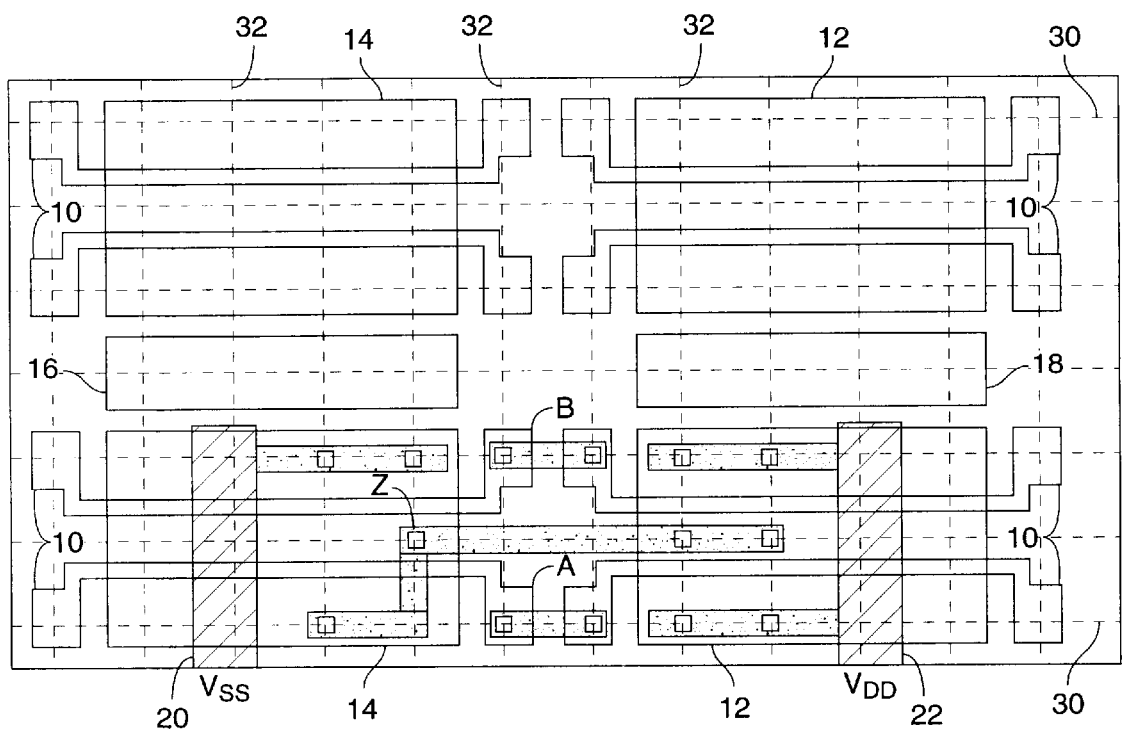
FIG. 1 is schematic depiction of a gate cell constructed in accordance with the prior art.
Figure 2:
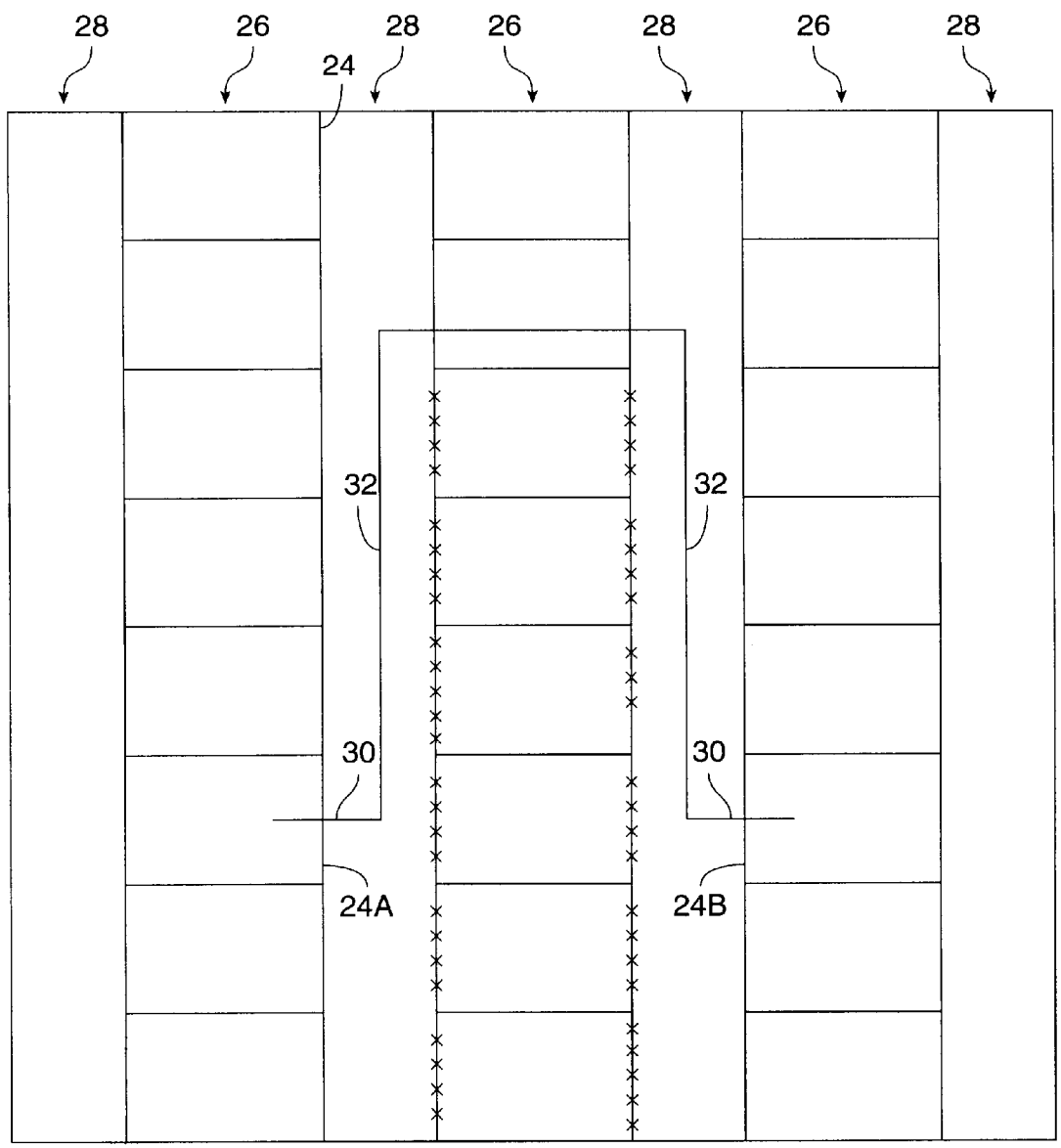
FIG. 2 is schematic depiction of a gate array cell architecture of the prior art

In contrast to the prior art of FIG. 1, and the embodiments of the invention depicted in FIGS. 2–5, well taps are provided that are located at the outer corners of the cell 60. Four taps 68–74 are depicted to show possible locations of the well taps, although only one well tap (e.g., 68 and 72) need be provided for each device in the cell 60. One tap is required on the top and bottom of every three cells (N well tap and p substrate tap). Hence, in the following description, only one tap for each device will be discussed.

The well tap 68 (or 70) is an N well tap, and the substrate tap 72 (or 74) is a P substrate tap in the illustrated embodiment. As can be understood by a comparison of FIG. 6 with FIG. 5, the size of the repeatable gate cell is reduced from eight transistors in FIG. 5 to four transistors in FIG. 6 by the removal of the well taps to the outer corners of the gate cell 60, rather than between two devises. Also, because of the location of the well taps 68, 72 to the outer corners of the gate cell 60, the power buses 76, 78 can be located at the outer portion of the gate cell 60. This allows the power buses 76, 78 to be shared between cells. This sharing of power buses 76, 78 is depicted in FIG. 6, which shows only a portion of adjoining gate cells 80, 82. The adjoining gate cells 80, 82 have the same construction as gate cell 60. In the illustration of FIG. 6, power bus 76 is a Vdd bus and power bus 78 is a Vss bus.

The power buses 76, 78 in the embodiment of FIG. 6 are in the second metallization layer. This enables more pins to be available at the top and bottom of each gate cell 60 as m1 can connect to the outside poly. Also, since the power buses 76, 78 and the well taps 68, 72 are shared between cells 60, the tapping density inside the cell is effectively reduced by fifty percent because each tap is shared between two rows of cells.

In the embodiment of FIG. 6, possible power strap locations 84, 86 are provided within the gate cell 60. Power straps, such as power strap 88, are located within the first metallization layer in one of these locations 84, 86. The location of power straps within the gate cell allows cells not to be skipped or for routing resources to be used just to put in power straps. A greater percentage of the cells in the gate array may then be used effectively.

A feature of the embodiment depicted in FIG. 6 is a double polysilicon connection 90, that is larger than conventional polysilicon connections. This double polysilicon connection 90 provides two connection points at the end of the polysilicon layers 62, rather than a single connection. This feature therefore provides a designer or design tool using the gate cell 60 of the present invention with greater flexibility in making connections to the polysilicon layer forming the transistor gate electrode. This is useful because due to the standard grid having excess gap area between the N and P diffusion.

Reference 91 in FIG. 6 points to possible input locations located at the top and bottom of all cells that can be routed in m1 from adjacent rows of cells.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A gate array cell architecture comprising:

an array of gate cells, at least one of the gate cells having:
- a first device including a first channel diffusion area and at least a first transistor gate electrode, the first device having an inner region that is interior within the gate cell and an outer region adjacent a first gate cell border;
- a second device including a second channel diffusion area and at least a second transistor gate electrode, the second device having an inner region that is interior within the gate cell and an outer region adjacent a second gate cell border, the inner regions of the first and second devices adjacent to each other;
- a first well tap at the outer region of the first device; and
- a second well tap at the outer region of the second device;
- wherein the gate cell shares the first well trap with a first adjacent gate cell in the array of gate cells and the second well tap with a second adjacent gate cell in the array of gate cells, with both said first and second devices being generally longitudinally aligned with said first and second adjacent gate cells, and with both said first and second devices being located intermediate said first and second adjacent gate cells.

2. The architecture of claim 1, further comprising a first power bus extending along the first gate cell border and a second power bus extending along the second gate cell border.

3. The architecture of claim 2, wherein the gate cell shares a same section of the first power bus with the first adjacent gate cell in the array of gate cells and a same section of the second power bus with the second adjacent gate cell in the array of gate cells.

4. The architecture of claim 3, wherein the gate cell has first and second metallization layers and the power buses are metal buses within the second metallization layer.

5. The architecture of claim 4, wherein the gate cell includes metal strap locations in the cell within the first metallization layer.

6. The architecture of claim 5, wherein at least one of the first and second transistor gate electrodes has a head with at least two connection points.

7. The architecture of claim 1, wherein the first device includes two transistors and the second device includes two transistors, such that the total number of transistors in the gate cell is four transistors.

8. A gate array cell architecture comprising:

an array of gate cells, at least one of the gate cells having:
- first means for controlling current in response to voltage signals including a first channel diffusion area and at least a first gate electrode, the first means having an inner region that is interior within the gate cell and an outer region adjacent a first gate cell border;
- second means for controlling current in response to voltage signals including a second channel diffusion area and at least a second gate electrode, the second device having an inner region that is interior within the gate cell and an outer region adjacent a second gate cell border, the inner regions of the first and second devices adjacent to each other;
- first means for tapping at the outer region of the first means for controlling; and
- second means for tapping at the outer region of the second means for controlling;
- wherein the gate cell shares the first means for tapping with a first adjacent gate cell in the array of gate cells and the second means for tapping with a second adjacent gate cell in the array of gate cells, said first and second means for tapping being located intermediate both said first and second adjacent gate cells.

9. The architecture of claim 8, further comprising first means for delivering power to the first means for controlling current along the first gate cell border and second means for delivering power along the second gate cell border.

10. The architecture of claim 9, wherein the gate cell shares the first means for delivering power with the first adjacent gate cell in the array of gate cells and the second means for delivering power with the second adjacent gate cell in the array of gate cells.

11. The architecture of claim 10, wherein the gate cell has first and second metallization layers and the first and second means for delivering power are metal buses within the second metallization layer.

12. The architecture of claim 11, wherein the gate cell includes metal strap locations in the cell within the first metallization layer.

13. The architecture of claim 12, wherein at least one of the first and second transistor gate electrodes has a head with at least two connection points.

14. The architecture of claim 8, wherein the first means for controlling includes two transistors and the second means for controlling includes two transistors, such that the total number of transistors in the gate cell is four transistors.

15. A method of forming a gate cell, comprising the steps of:

- forming a first device including a first channel diffusion area and at least a first transistor gate electrode, the first device having an inner region that is interior within the gate cell and an outer region adjacent a first gate cell border;
- forming a second device including a second channel diffusion area and at least a second transistor gate electrode, the second device having an inner region that is interior within the gate cell and an outer region adjacent a second gate cell border, such that the inner regions of the first and second devices are adjacent to each other;
- forming a first well tap at the outer region of the first device;
- forming a second well tap at the outer region of the second device; and
- forming another gate cell adjacent to the gate cell such that the gate cells share the first well tap, both of said first and second devices being generally longitudinally aligned with respect to the adjacent gate cell.

16. The method of claim 15, further comprising forming a first power bus extending along the first gate cell border and a second power bus extending along the second gate cell border.

17. The method of claim 16, further comprising connecting the another gate cell to the first power bus such that the gate cells share a same section of the first power bus.

18. The method of claim 17, wherein the gate cell has first and second metallization layers and the step of forming the first and second power buses includes forming metal buses within the second metallization layer.

19. The method of claim 18, wherein the step of forming a gate electrode includes forming a head on the electrode with at least two connection points.

* * * * *